United States Patent [19]

Fenlon et al.

[11] Patent Number: 4,905,357
[45] Date of Patent: Mar. 6, 1990

[54] METHOD FOR MANUFACTURING RESONATORS WITH BEVELED ENDS

[75] Inventors: Paul F. Fenlon, Elmwood Park; Gregory Gawreluk, Elmhurst, both of Ill.

[73] Assignee: Motorola, Inc., Schaumburg, Ill.

[21] Appl. No.: 375,171

[22] Filed: Jul. 3, 1989

[51] Int. Cl.$^4$ .............................................. H01L 41/22
[52] U.S. Cl. ..................................... 29/25.35; 51/313; 51/316; 310/368; 29/423
[58] Field of Search ............................ 29/25.35, 423; 310/321-325, 367, 368; 51/313-316

[56] References Cited

U.S. PATENT DOCUMENTS 4,476,411 10/1984 Okazaki et al. ..................... 310/361
4,630,359 12/1986 Hill et al. ............................ 29/602.1

OTHER PUBLICATIONS

Paper entitled "Miniature AT-cut Strip Resonators with Tilted Edges" by Morio Onoe and Masanobu Okazaki, May 1975, Proceedings of the 29th Annual Symposium on Frequency Control, pp. 42-48.

*Primary Examiner*—Carl E. Hall
*Attorney, Agent, or Firm*—Charles L. Warren

[57] ABSTRACT

An assembly of a plurality of resonators is formed in which the resonators are held edge to edge and fixed relative to each other. The assembly is held together by two rigid strips mounted on opposing surfaces near the central regions of the resonators. The assembly is disposed in a longitudinal pipe which contains an abrasive material. The pipe is rotated about its axis causing the assembly to nonrandomly tumble in the abrasive so that the projecting ends of the resonators have material removed. Thus, resonators having rounded or contoured ends are produced.

6 Claims, 1 Drawing Sheet

METHOD FOR MANUFACTURING RESONATORS WITH BEVELED ENDS

BACKGROUND OF THE INVENTION

This invention is directed to the manufacture of resonators, especially quartz crystal resonators, and is specifically directed to longitudinal resonators requiring a cylindrical bevel near each end.

The use of quartz crystals as resonators is well-known in the art. It is also well-known that various "cuts" of quartz crystals have different properties when utilized as resonators. The design of a particular resonator involves enhancing a desired mode of vibration while minimizing undesired modes. Because of the many possible modes of operation, it is often desirable to use specific geometries in order to minimize coupling undesired modes from the desired mode.

Various types of tapers, bevels, and irregular physical dimensions have been utilized to minimize undesired responses. For example, AT-cut strip quartz resonators, especially when dimensioned to operate at low frequencies, have minimized undesired modes of operation when the ends of the strip are cylindrically beveled or rounded. Normally, such strip resonators are manufactured from a uniform thickness wafer of quartz so that the beveling or rounding at the ends require the removal of material.

Such material can be removed by the use of an abrasive grinding wheel. Material can also be removed from the crystal strips by placing them in a pipe with an abrasive grit and causing the pipe to rotate about its axis. Quartz material is removed as the strips repeatedly come in contact and randomly tumble in the grit. As will be appreciated, randomly tumbling such strips in a pipe with abrasive grit may cause certain strips to have material undesirably removed in center locations while others may have insufficient materials removed at the ends.

It is an object of the present invention to provide an improved process for manufacturing resonators which require rounded ends.

DETAILED DESCRIPTION OF THE PREFERRED EMBODIMENT

Figure 1:
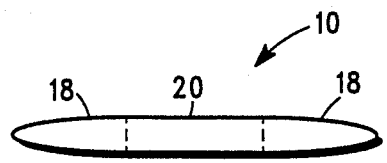
FIG. 1 is an edge view of a quartz crystal wafer having rounded ends.
Figure 2:
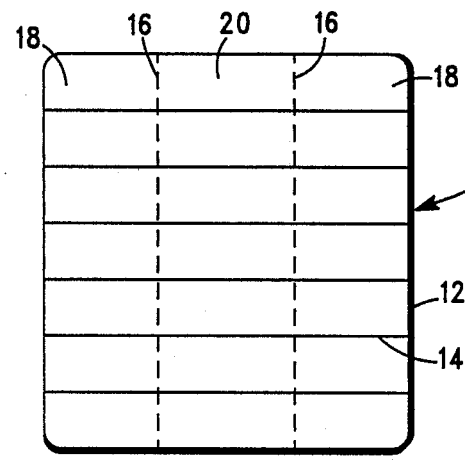
FIG. 2 is a top view of the wafer as shown in FIG. 1.

The exemplary method of the present invention which follows is directed to removing material from an AT strip quartz resonator. However, this invention also applies to other quartz crystal cuts and resonators made of other materials. FIGS. 1 and 2 illustrate a quartz wafer 10 which is dimensioned to contain individual strip resonators 12 which will be dissected from the wafer along lines 14. The dashed lines 16 segregate the wafer and strips into three regions: end regions 18 and a center region 20. Preferably, in the finished condition, the surfaces at region 20 are maintained flat and parallel while the end regions 16 are rounded or cylindrically tapered as best seen in FIG. 1. This tapering or rounding of the end regions assist in minimizing undesired responses in the finished strip resonators. Each resonator will be finished by plating the opposing surfaces in region 20 with a metal which defines the desired or active region of vibration.

Figure 3:
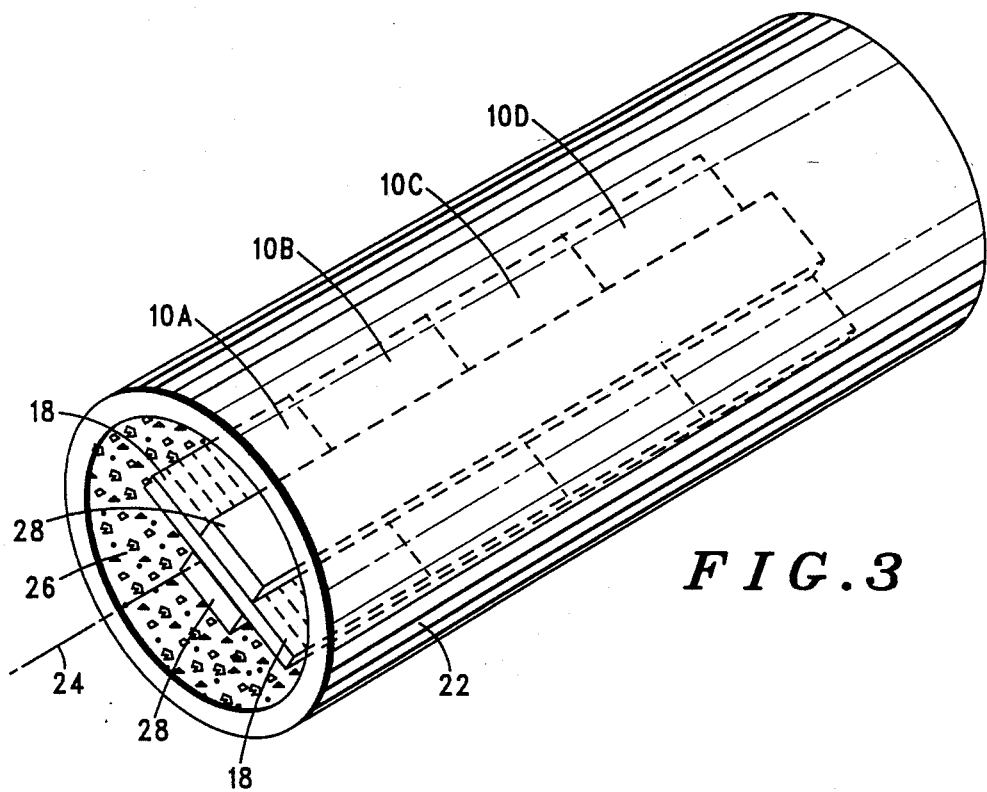
FIG. 3 illustrates an apparatus for accomplishing the improved method according to the present invention.

FIG. 3 shows a hollow pipe 22 disposed to be rotated about its longitudinal axis 24 such as by a conventional motor to provide a tumbling action for internal objects. An abrasive grit 26 is disposed within the pipe 22. A plurality of quartz wafers 10A-10D are also disposed within the pipe and are held edge to edge by opposing strips 28 of stiff metal stock. This holds the wafers in a fixed position relative to each other. The strips 28 may be mounted to the quartz wafers by using wax or a heat sensitive adhesive so that the strips can be removed from the wafers following the grinding (contouring) operation. The dotted lines on wafer 10A illustrate the individual strip resonators which are preferably separated from the wafer following the contouring operation. The protruding end regions 18 are exposed on both major surfaces to the abrasive grit 26 as the pipe 22 rotates about its axis.

Preferably the number of quartz wafers or separated resonators held by strips 28 is such that the overall length of the assembly is substantially longer than the diameter of pipe 22. This causes the assembly to tumble within the pipe in a nonrandom manner, i.e. the longitudinal axes of strips 28 remain parallel to the axis of the pipe. The motion of the assembly within the pipe promotes uniformity in the lapping or grinding of the end regions 18 of the wafers. Preferably strips 28 have a width substantially equal to the middle region 20 of the quartz strips and thus protect the active regions from the undesired removal of material.

It will be apparent that the ends of pipe 22 will be covered during operation to contain the assembly and the grit within the pipe. It may be necessary to periodically remove the assembly and grit from the pipe and replace the old grit with new grit and return the assembly to the pipe for further lapping. Depending of the amount of material to be removed, the crystal may require several weeks of tumbling in order to obtain the desired contour. The pipe 22 is preferably oriented so that its axis is horizontal in order to maintain equal distribution of the grit 26 during the tumbling operation.

After the end regions of the wafers have been sufficiently rounded, the assembly is removed from pipe 22 and the strips 28 removed from the wafers such as by heating the assembly to cause a wax or heat sensitive adhesive to release the strips from the wafers. Following the removal of strips 28, the contoured wafers may be fabricated in a conventional manner.

Although the method according to the present invention can be utilized to hold a series of separate strip resonators edge to edge during the contouring operation, it is believed that it is more efficient to contour and generally handle quartz wafers rather than individual strips. It will be understood by those skilled in the art that various conventional finishing steps such as etching, cleaning, base plating, mounting, finish plating, and sealing maybe required following the contouring operation. These steps may be carried out using known methods.

Although an illustrative method according to the present invention has been described above, the scope of the invention is defined by the claims which follow.

What is claimed is:

1. A method of contouring the ends of resonators comprising the steps of:

forming an assembly of a plurality of resonators held edge to edge and fixed relative to each other;

disposing said assembly within a longitudinal pipe which contains an abrasive material, each resonator having end regions exposed to the abrasive; and rotating the pipe about its axis thereby causing the assembly to nonrandomly rumble in the abrasive and resonator material to be removed from the end regions of the resonators, said assembly having a length at least equal to the diameter of the pipe.

2. The method according to claim 1 wherein said assembly forming step includes the step of releasably securing two strips of rigid material to opposing central surfaces of the resonators.

3. The method according to claim 1 wherein said assembly forming step includes the step of forming an assembly of resonator wafers in which each wafer contains a plurality of resonators.

4. The method according to claim 1 wherein said assembly forming step includes the step of forming an assembly which has a length substantially longer than the diameter of the pipe to promote controlled tumbling of the assembly parallel to the axis of the pipe.

5. The method according to claim 2 wherein said assembly forming step includes the step of preventing the central region of the resonators from contacting the abrasive.

6. The method according to claim 1 wherein said assembly forming step includes the step of forming an assembly of quartz crystal resonators.

* * * * *